(12) United States Patent
Burrows et al.

(10) Patent No.: US 9,633,823 B2
(45) Date of Patent: Apr. 25, 2017

(54) PLASMA EMISSION MONITOR AND PROCESS GAS DELIVERY SYSTEM

(71) Applicant: Cardinal CG Company, Spring Green, WI (US)

(72) Inventors: Keith J. Burrows, Mineral Point, WI (US); Christopher L. Gruber, Plain, WI (US); Klaus H. W. Hartig, Avoca, WI (US)

(73) Assignee: Cardinal CG Company, Eden Prairie, MN (US)

( * ) Notice: Subject to any disclaimer, the term of this patent is extended or adjusted under 35 U.S.C. 154(b) by 746 days.

(21) Appl. No.: 13/803,371

(22) Filed: Mar. 14, 2013

(65) Prior Publication Data

US 2014/0262751 A1     Sep. 18, 2014

(51) Int. Cl.
| | |
|---|---|
| C23C 14/35 | (2006.01) |
| H01J 37/32 | (2006.01) |
| C23C 14/54 | (2006.01) |
| C23C 14/00 | (2006.01) |
| H01J 37/34 | (2006.01) |

(52) U.S. Cl.
CPC .... H01J 37/32449 (2013.01); C23C 14/0042 (2013.01); C23C 14/54 (2013.01); C23C 14/542 (2013.01); C23C 14/544 (2013.01); H01J 37/3244 (2013.01); H01J 37/32972 (2013.01); H01J 37/34 (2013.01)

(58) Field of Classification Search
CPC ............. H01J 37/32449; H01J 37/3244; H01J 37/32972; C23C 14/542; C23C 14/544
See application file for complete search history.

(56) References Cited

U.S. PATENT DOCUMENTS

| | | | | |
|---|---|---|---|---|
| 5,622,606 | A  * | 4/1997 | Kugler | ................ C23C 14/0063 204/192.12 |
| 6,454,920 | B1 * | 9/2002 | Haag | ....................... C23C 14/35 204/298.07 |
| 2001/0015175 | A1 | 8/2001 | Masuda et al. | |
| 2008/0236748 | A1* | 10/2008 | Kobayashi | ........ H01J 37/32522 156/345.27 |

FOREIGN PATENT DOCUMENTS

GB          2277327 A       10/1994

OTHER PUBLICATIONS

International Search Report and Written Opinion for PCT/US2014/021516, May 22, 2014, 11 pages.

* cited by examiner

*Primary Examiner* — Jason M Berman
(74) *Attorney, Agent, or Firm* — Fredrikson & Byron, P.A.

(57) ABSTRACT

A gas manifold for delivery gas to a sputtering chamber is provided with ports to accommodate plasma emission monitors to monitor plasma information in the sputtering chamber to provide feedback control. The collimators of the plasma emission monitors is exposed to gas flow and thus coating of the monitor is greatly reduced.

20 Claims, 9 Drawing Sheets

OXYGEN PLASMA EMISSION SPECTRUM

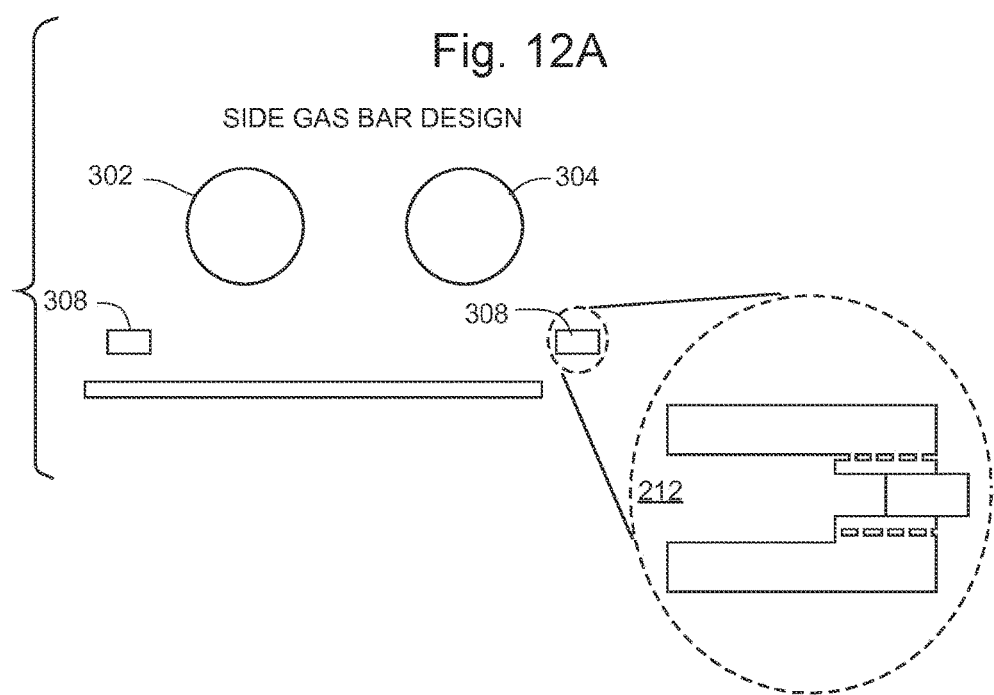

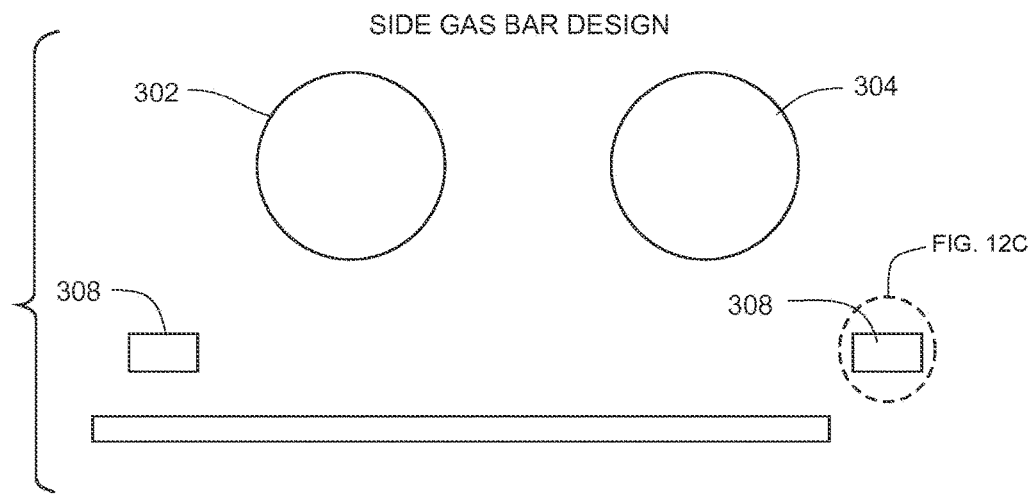
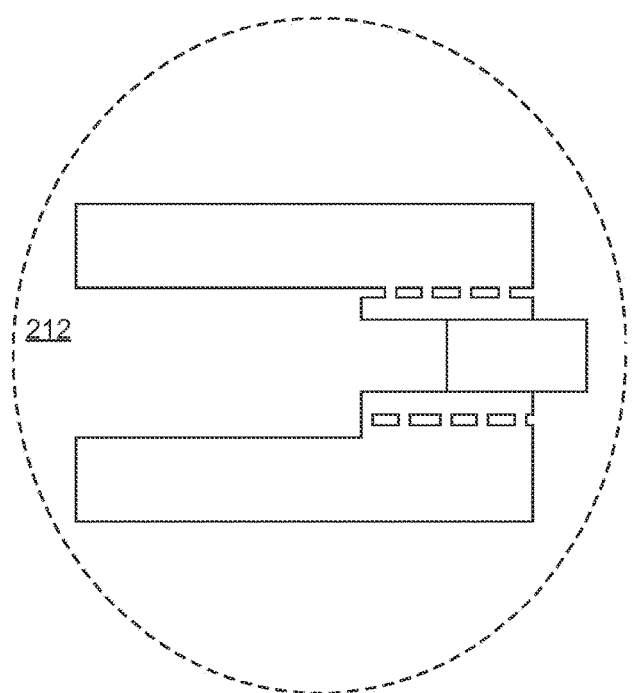

PLASMA EMISSION MONITOR AND PROCESS GAS DELIVERY SYSTEM

FIELD OF THE INVENTION

The embodiments of the present invention relate to apparatus and methods used for controlled sputter deposition of thin films on substrates in a coating chamber. More specifically, the embodiments of the present invention relate to sputtering methods and sputtering apparatus that monitor the emission intensity of plasma and provide control to the gas delivery system.

DESCRIPTION OF RELATED ART

In the coated glass industry it is desirable to apply one or more thin layers of coating materials to one or both surfaces of glass sheets to provide desired characteristics to the finished coated glass product. For example, it is often desirable to apply infrared-reflective coatings and/or other multilayer coating systems to provide desirable characteristics related to transmittance, emissivity, reflectance, durability, color, photocatalysis and/or chemical resistance.

It can be argued that sputter deposition is frequently the most effective method of forming thin films on substrates. Compared with other thin-film formation methods such as vacuum evaporation, electroplating, electroless plating, and chemical vapor deposition, sputter deposition can allow for more variety with respect to selection of film materials, higher purity and controlled composition of the film, greater adhesive strength and homogeneity of the film, and greater control of the film thickness.

In conventional sputtering deposition systems, a substrate is generally conveyed through a vacuum chamber. The chamber contains a target made of or including sputterable material on its outer surface. Sputtering occurs when energized ion particles impinge on the target's surface, causing liberation of target atoms. In reactive sputtering, such liberated target atoms combine with reactive gas atoms to form a dielectric material, which is in turn deposited onto the substrate.

The deposition process often involves direct current ("DC") reactive sputtering. To achieve such sputtering, an electrical field is created in the vacuum chamber. Typically, a DC negative voltage is applied to the target in creating a cathode and a DC positive voltage is applied to other apparatus provided in the chamber at a location spaced away from the target in creating an anode. As such, the electrical field is created between the cathode and the anode. One or more gases are introduced into the vacuum chamber. Electrons in the electrical field are accelerated and gain enough energy to ionize the gas atoms and create glow discharge plasma. For example, an inert gas, such as argon, can be used in producing such plasma. Additional gases may also be introduced to chamber if desired, such as one or more reactive gases. As the ions are drawn to the target by the electric field of the cathode sheath, they bombard the target and liberate atoms. As described above, when such bombarding and liberating is conducted in the presence of a reactive gas such as oxygen or nitrogen, a reactive product of coating material (i.e., the product of the liberated target atoms and the reactive gas atoms) is generated, much of which is deposited on the substrate. For example, introducing a reactive gas such as oxygen or nitrogen to the chamber forms an oxide or nitride with the liberated target atoms.

One disadvantage of DC reactive sputtering is a disappearing anode issue. This issue occurs when the anode gradually becomes coated with dielectric material. As is known, dielectric material often coats every surface in the chamber (including the substrate) and eventually coats the anode. When an area on an anode becomes coated, the conducting path for electrons in that area is compromised, causing the coated area to lose its ability to conduct electrons, and thereby cutting off the current path for electrons emitted from the process. When this happens, the electrons typically conduct to an uncoated area on the anode or, if the anode is covered by sputtered dielectric material, as quite often is the case, a less coated area on the anode.

Another method involves using a gas manifold as an anode. Generally, the gas manifold is isolated from ground and connected to a positive side of the output of a power supply. Gas enters into the manifold through an inlet and exits through one or more outlets. The pressure around the outlets is generally higher as compared to the rest of the sputtering chamber. When sputtering occurs, a majority, if not all, the outer manifold surfaces are eventually coated with a dielectric material. However, the gas streaming outward from the manifold outlets prevents the sputtered material from coating over the outlets. The outlets then become the preferred conduction paths for electrons. These paths are somewhat enhanced due to the in-streaming electrons colliding with the out-streaming gas, which is at a locally elevated pressure. These collisions produce plasma plumes at each outlet. Since the plasma is electrically conductive, each plume serves as a virtual anode that cannot be coated.

As is known, a typical manifold in a sputtering system includes a tube with an inlet at one point and holes (e.g., drilled periodically along the tube's length) that act as the outlets. However, because there is a different gas conductance between the manifold inlet and each outlet, the distribution of gas is non-uniform. This can be modified, to a degree, by changing the relative size of the tube diameter and the outlet diameters. As the tube diameter is increased, the conduction path to each outlet is improved, leading to an improved gas distribution. Alternatively, reducing the conductance through the outlets helps improve distribution by increasing the pressure inside the tube, which enhances distribution of the gas. However, either of these modifications has the adverse effect of increasing the gas capacity of the tube. The capacity, i.e., the total amount of gas in the manifold, can be thought of as the product of volume and pressure. By increasing the gas capacity of the tube, response time is slowed for any closed loop feedback control used to control the gas. This is because all the gas in the manifold must exit the manifold before any change can take effect in the process chamber.

In the reactive sputtering processes, a film forming condition, in particular, a gas flow rate, has a narrow suitable range and thus difficulties arise in controlling film forming parameters such as uniformity in sheet resistance and transmittance, when the film is formed on a substrate. Uniformity of the distribution of the gas is key.

As an improvement, there is known a reactive sputtering process employing a plasma emission monitor (i.e., "PEM"). The PEM is a device for collecting plasma emissions by a collimator, introducing the emissions to a photomultiplier through a filter or to a spectroscope, and monitoring a plasma state with an electrical signal obtained through photoelectric conversion of the emissions by the photomultiplier. In a sputtering apparatus employing a PEM, the function of adjusting the flow rate of an introduced reactive gas and holding the emission intensity of plasma constant can be developed with the sensitivity of the photomultiplier of the PEM set to a certain value.

One downfall of PEMs is that they are exposed to the plasma and the collimator's optical probe (where the light enters) gets coated over with time as is true of the other objects in the vacuum chamber. To prevent or reduce this occurrence, some Plasma Emission Monitor manufacturers employ a gas shield that flows in front of the optical probe thereby deflecting material away from the optical probe. A disadvantage associated with such a method is that the amount of gas necessary to adequately shield the optical probe is on the order of about 50 sccms. This amount of gas is a significant percentage of the total gas flow in a sputtering process which ranges from about 100 to about 1000 sccms per pair of cathodes, depending on the size of the cathodes. The uniformity of distribution of the gas into the chamber is disrupted by the introduction of this additional gas.

Alternatively, another method is to mount the optical probe of the collimator far away from the plasma and preferably installing a tube in front of the optical probe to limit the deposition of material on the lens of the optical probe. A disadvantage with this approach is that it greatly reduces the signal collected by the optical probe and thus the sensitivity of the measurements made by the PEM.

The embodiments of the invention are designed to provide strong emission intensity readings while reducing the amount of buildup on the lens of the collimators without adversely compromising the uniformity of gas distribution in the chamber.

According to one aspect of the invention there is provided a gas delivery system for use in a sputtering chamber. The system includes a gas manifold and a collimator port. The gas manifold has an inlet port and a plurality of outlet ports, the inlet port is operatively coupled to the gas supply so as to receive gas at a selected gas pressure and each of the plurality of outlet ports are located within the sputtering chamber. The inlet port is in fluid communication with each of the plurality of outlet ports via paths of at least substantially equal conductance. The collimator port is in fluid communication with one of the outlet ports so that a lens end of an optical probe when received in the collimator port is exposed to gas flowing to the outlet port to which it is in fluid communication, the optical probe operatively coupled to a plasma emission monitor.

According to another aspect of the invention, there is provided a sputtering apparatus including a vacuum chamber, a gas supply, a first gas manifold and a collimator port. The vacuum chamber contains a substrate to be coated by a sputtering process. The first target is mounted in the vacuum chamber and is adapted to be energized as a cathode and has a surface to be sputtered for coating the substrate. The first gas manifold has an inlet port and a plurality of outlet ports, the inlet port is operatively coupled to the gas supply so as to receive gas at a selected gas pressure and each of the plurality of outlet ports is located within the sputtering chamber. The inlet port is in fluid communication with each of the plurality of outlet ports via paths of at least substantially equal conductance. The collimator port is in fluid communication with one of the plurality of outlet ports so that a lens end of a first optical probe when received in the collimator port is exposed to gas flowing to the outlet port to which it is in fluid communication, the optical probe operatively coupled to a plasma emission monitor.

According to another aspect of the invention, there is provided a sputtering method for forming a film on a substrate in a film forming space, the method includes the steps of:

introducing at least one gas into the film forming space at a selected gas pressure, the film forming space having a first target mounted in a vacuum chamber, the first target adapted to be energized as a cathode and having a surface to be sputtered for coating the substrate, a gas supply and a first gas manifold having an inlet port and a plurality of outlet ports, the inlet port operatively coupled to the gas supply so as to receive gas at a selected gas pressure and each of the plurality of outlets located within the vacuum chamber, the inlet port in fluid communication with each of the plurality of outlet ports via paths of at least substantially equal conductance; and monitoring emission intensity of plasma formed the in the film forming space with an optical probe having a first end for gathering light, the optical probe operatively coupled to a plasma emission monitor wherein the optical probe is located in the first gas manifold adjacent to at least one of the plurality of outlet ports of the first gas manifold so that the first end of the optical probe is exposed to the gas flowing to the outlet port to which it is adjacent.

According to still another aspect of the invention, there is provided a gas manifold for delivering gas in a sputtering chamber. The manifold includes:

a body having an inlet port and a plurality of outlet ports, the inlet port operatively coupled to the gas supply, the inlet port is fluid communication with each of the plurality of outlet ports a collimator port having a proximal and a distal end, the collimator port located in the body separate from the inlet and outlet ports, the collimator port dimensioned to receive an optical probe therein, wherein the distal end of the collimator port is fluidly coupled to an outlet port so that gas delivered to that outlet port flows past the distal end of the collimator port.

BRIEF DESCRIPTION OF THE DRAWINGS

FIG. 12A is a schematic side view of a sputtering apparatus according to another embodiment of the present invention located in a sputter chamber.

FIG. 12B is a schematic side view of a sputtering apparatus according to another embodiment of the present invention located in a sputter chamber.

FIG. 12C is a schematic side view of a sputtering apparatus according to vet another embodiment of the present invention located in a sputter chamber.

DETAILED DESCRIPTION OF PREFERRED EMBODIMENTS

Figure 1:
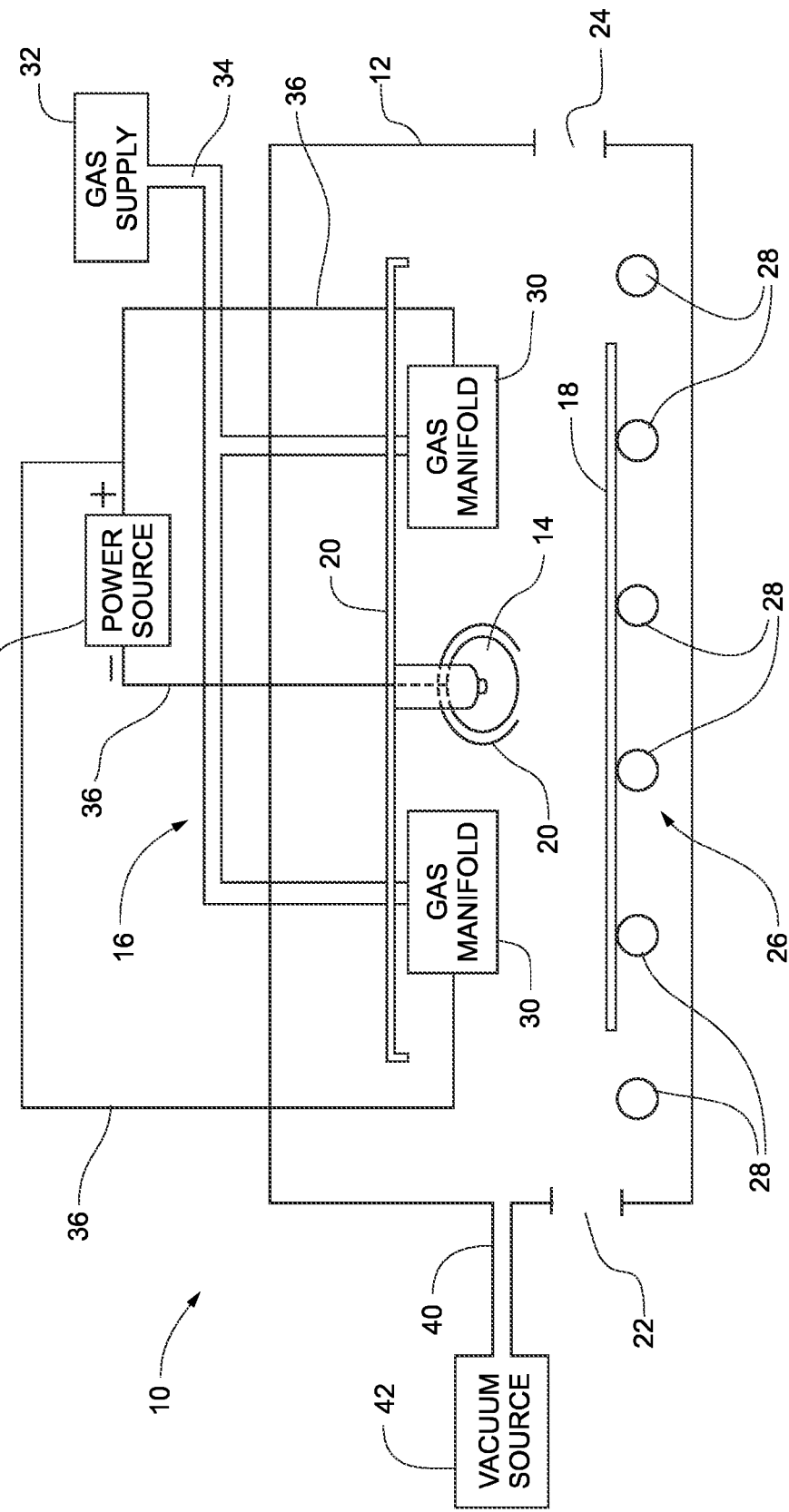
FIG. 1 is a schematic side view of a sputtering apparatus according to the prior art.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

Embodiments described herein generally relate to depositing a transparent dielectric film, such as a metal oxide film, on a substrate; however, the invention should not be limited to such. For example, the invention may also be used for metallic deposition processes. In the coated glass industry, the substrate would generally be a glass sheet. However, plastic and other types of substrates can also be used. The term "metal" is used to indicate such elements as zinc, aluminum, titanium, niobium, zirconium, etc. In addition, the term metal is defined so as to also include silicon and other metalloids not normally considered to be metals.

More particularly, embodiments described herein relate to sputtering a metal-containing target within a controlled chamber by introducing a gas into the chamber via a gas manifold. The gas can include a single gas or a mixture of two or more gases. In certain embodiments, the gas includes one or more inert gases, such as argon, and/or one or more reactive gases, such as oxygen, nitrogen, etc. Preferably, the gas is introduced into the sputtering chamber in a manner enabling one to control the ratio of mass flow rates of the gases.

Embodiments of the invention generally involve the gas manifold having an inlet and a plurality of outlets, whereby the inlet is in fluid communication via paths of equal conductance, or substantially equal conductance, with each of the outlets. In certain embodiments, the gas manifold is a binary manifold where the inlet is evenly split into two paths of equal conductance. In certain embodiments, each of the two paths can be continually and evenly split into further paths until a quantity of the paths equals a desired plurality of outlets. For example, if sixteen outlets are desired, the two paths stemming from the inlet would be evenly split, and subsequently, the resulting four paths would each be evenly split, and further, the resulting eight paths would each be evenly split to provide the desired sixteen outlets. Such is a case in which the paths of the manifold would generally have equal conductance. However, the gas manifold may instead be configured for providing paths of substantially equal conductance. As such, if fourteen outlets are desired, using the above example, six of the eight resulting paths can be evenly split to provide a gas manifold system with fourteen paths of substantially equal conductance. The remaining two of the eight resulting paths may be dimensionally adjusted to have similar conductance, albeit physically dissimilar, as the other twelve paths (provided from the six evenly-split paths). The inlet of the gas manifold is operatively coupled to one or more gas supplies.

The gas manifold, in any of its exemplary representations (as described below), can be used in sputter depositing a wide variety of coatings. As such, the invention should not be limited based on any specific coating being deposited. In certain embodiments, a method of depositing an oxide film can be provided in using the gas manifold. For example, the method can involve providing a sputtering chamber (such as that exemplified in FIG. 1 as described below) equipped with at least one sputtering target. Each target can optionally comprise metallic sputterable material (although, the sputterable material can alternatively be an oxide, such as a suboxide). The method can be advantageously used for sputter depositing an oxide film selected from the group consisting of zinc oxide, tin oxide, zinc tin oxide, titanium oxide, and silicon oxide.

As described below, the gas manifold, in any of its exemplary representations, can be provided to increase ionization during sputtering. This may provide improved film properties, such as density, morphology, etc. In certain embodiments, a method for depositing a film on a #1 surface of a substrate (e.g., the exterior surface of an outboard pane of a window or other glazing) can be provided. For example, the method may involve depositing the film on a desired surface of a pane, and then installing the pane such that the thus coated surface is a #1 surface exposed to an outdoor environment (optionally exposed to periodic contact with rain). In certain embodiments, the film may comprise silica and/or titania; however, as described above, the invention should not be limited to such. For example, the film can comprise silica that is deposited directly on the pane. Another example can involve depositing a coating comprising titania (e.g., TiO2). The coating, for example, can be a photocatalytic coating, and low-maintenance properties of the TiO2 may be improved due to the increased ionization provided by the manifold.

Further, in certain embodiments, at least one target and gas manifold may be mounted below a path of substrate travel (e.g., at a lower elevation than transport rollers or another substrate support) extending through a sputtering chamber. In such embodiments, the sputtering chamber includes at least one lower sputtering chamber, which is/are mounted below the path of substrate travel. In operation, the method involves sputtering each lower target(s) upwardly (optionally between spaced-apart transport rollers) so that sputtered film is deposited upon a bottom surface of a substrate being conveyed through the chamber.

FIG. 1 illustrates a schematic front view of a magnetron sputtering system 10 in accordance with the prior art. Sputtering techniques and equipment utilized in magnetron sputtering systems are quite well known in the art. For example, magnetron sputtering chambers and related equipment are available commercially from a variety of sources (e.g., Leybold). Examples of useful magnetron sputtering techniques and equipment are also disclosed in a number of United States patents, such as U.S. Pat. No. 4,166,018, issued to Chapin, the applicable teachings of which are incorporated herein by reference.

The system 10 of FIG. 1 includes a deposition chamber 12 defining a controlled environment (i.e., a vacuum chamber); a target 14; and a gas distribution system 16. The deposition chamber 12 generally includes metallic walls, typically made of steel or stainless steel, operably assembled to form a chamber that can accommodate a vacuum in which the sputtering process occurs. Within or partially within the deposition chamber 12 is the target 14. As should be appreciated, the target 14 can generally be any shape, e.g., cylindrical or planar, and even though only a single target 14 is shown in FIG. 1, two or more targets 14 can be used within the chamber 12.

In some embodiments, the target 14 includes a tubular backing formed of electrically conductive material, such as stainless steel, aluminum or any other suitably conductive material. The outer surface of the target 14 is defined by sputterable material. Alternately, the target 14 can be planar and can include a conductive backing plate, with a slab of the target material to be sputtered affixed to the backing plate by any mechanical method or by solder or adhesive as is well known to those of ordinary skill in the art. In some cases, the entire target 14 can be formed of the material to be sputtered. As briefly described above, sputterable target materials include, but are not limited to, materials such as silicon, zinc, tin, aluminum, copper, titanium, niobium, zirconium, or combinations thereof. Preferably, atoms of these target materials can be reacted with atoms of a reactive gas, such as oxygen, nitrogen, etc., or combinations thereof, to form dielectric coatings, such as zinc oxide, silicon nitride or the like. The target 14 can include one or more optional shield assemblies 20 and optional magnet assemblies (not shown), and in the case of a rotating cylindrical target, is further connected to a motor assembly (not shown). As is known, for rotating cylindrical cathodes, such motor assemblies optimize the efficiency of the target 14 by rotating the target 14 through the plasma generated in the sputtering system 10.

The deposition chamber 12 optionally includes an entry door (or "tunnel") 22 and exit door (or "tunnel") 24 for the substrate 18, thereby enabling continual feeding of substrates (or work pieces) through the chamber 12. A support system 26 for the substrate 18 may include transport rollers 28, but may alternatively include conveyor belts that extend along the width of the substrate to support the substrate as it travels through the chamber. The illustrated substrate 18 rests upon the transport rollers 28 and is brought into the deposition chamber 12 through the entry door 22 via rotation of the rollers 28. The rollers 28 may be rotated at a speed that results in the substrate moving through the chamber at about 100-500 inches per minute. Once the substrate 18 has been coated, it exits the illustrated deposition chamber 12 through the exit door 24.

The gas distribution system 16 generally includes one or more gas manifolds 30, through which one or more sputtering gases are introduced into the deposition chamber 12; a gas supply 32; and a gas conduit 34, through which gas is delivered from the gas supply 32 to the gas manifolds 30. While two gas manifolds 30 are exemplarily shown in FIG. 1, with each represented as a block, it is to be appreciated that embodiments of the invention can include any number of (e.g., one or more) gas manifolds. In certain embodiments, high current electric conductor lines 36 electrically connect a power source 38 to the target 14 and one or more other components of the gas distribution system 16. As further described below, in accordance with certain embodiments of the present invention, a positive voltage is delivered (e.g., via one or more of the electric conductor lines 36) to the gas manifolds 30 or to a conductive mass (not shown) located therein, thereby creating anodic surfaces that are positioned in sufficient proximity to the target 14. This positioning of the anodic surface or surfaces assists in maintaining the plasma and stabilizing the zone of sputtering gas adjacent to the exterior surface of the target 14 (sputtering zone).

In the sputtering process, after the initial preconditioning of the deposition chamber 12, the gas supply 32 provides a supply of gas, e.g., an inert gas such as argon, through the gas manifolds 30. The gas can involve one or more gases. The system 10 can involve other gases being provided through the gas manifolds 30 in combination with, or instead of, an inert gas. As such, while there is only one gas supply 32 and one gas conduit 34 represented in the system 10, there can alternatively be a plurality of gas supplies and gas conduits each connecting one of the gas supplies to the gas manifolds 30. For example, the deposition chamber 12 can be operably coupled to both a supply of oxygen gas and a supply of argon gas via respective gas conduits connecting to the gas manifolds 30. Such respective gas distribution pipes would enable oxygen and argon gases to flow into the chamber 12. In addition, oxygen and argon gases may be mixed together before they enter the gas manifolds 30, or may be introduced separately into the manifolds 30. The flow of each gas into the gas manifolds 30 can be set at different mass flow rates. As such, flow regulators (not shown) are preferably employed to control the flow rate of each gas into the gas manifolds 30, and in turn, into the chamber 12. For example, the gas may be introduced to the deposition chamber 12 until a pressure in the range of about 1 mtorr-20 mTorr is achieved. In order to maintain the chamber pressure in the range of about 1 mtorr-20 mTorr in this example, additional gas is added over time.

As described above, using a conventional tube-shaped gas manifold (e.g., having holes drilled through the tube surface to serve as the manifold outlets) in a deposition chamber often results in a non-uniform distribution of gas being provided from such manifold. This is generally disadvantageous because it compromises the homogeneity of the plasma created in the deposition chamber. In turn, non-homogeneous plasma can eventually lead to uneven deposition. As described above, while various methods of configuring such tube-shaped gas manifolds have been used to enable a more uniform gas distribution, such methods have generally been found to negatively impact the gas capacity of the manifolds. In turn, the response time of these gas manifolds is compromised. To overcome these limitations, in certain embodiments, a gas manifold is used having equal, or substantially equal, conductance paths between an inlet and each outlet of the manifold. In certain embodiments, a binary manifold is used. Using a gas manifold having equal, or substantially equal, conductance paths one can achieve substantially uniform gas distribution while also maintaining response time of the manifold. As a result, more homogeneous plasma can be achieved so as to promote a consistent deposition process.

Figure 2:
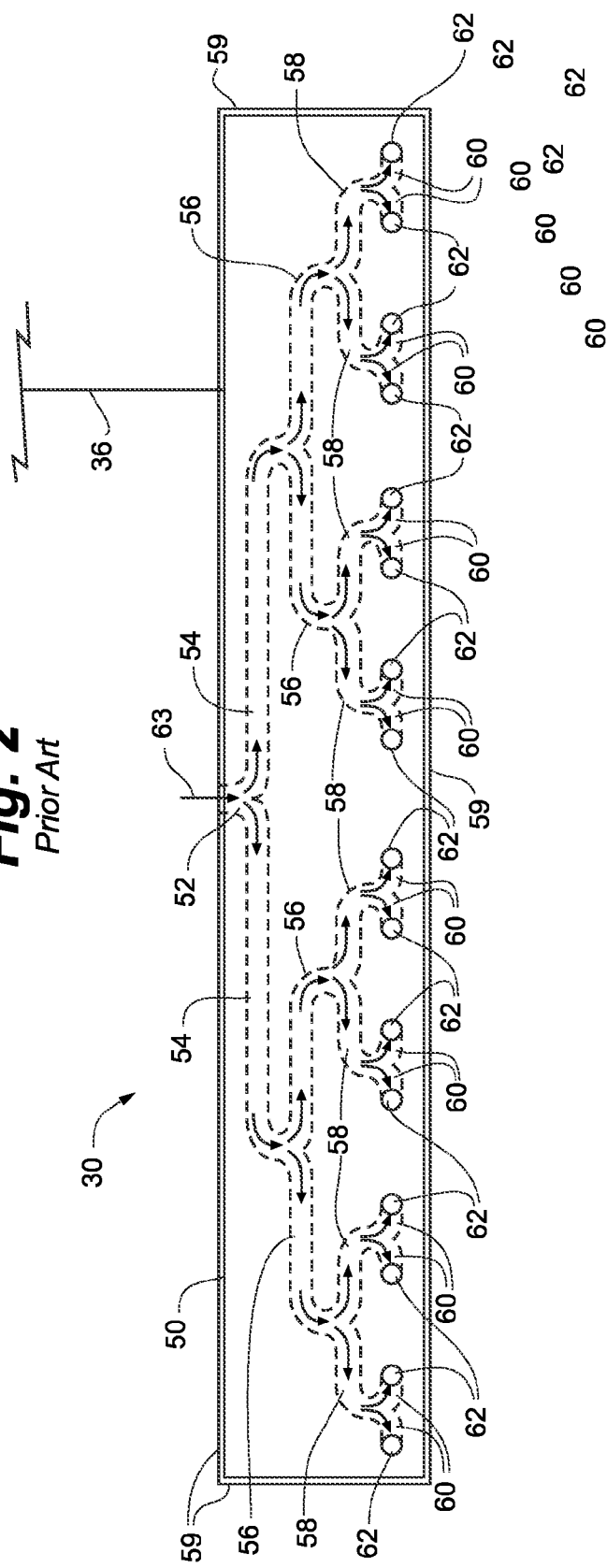
FIG. 2 is a schematic front view of a gas manifold assembly used in FIG. 1 according to the prior art.

FIG. 2 shows a schematic front view of a gas manifold 50 that can be used for the gas manifold 30 of FIG. 1 in accordance with certain embodiments of the invention. As shown, a gas inlet 52 of the gas manifold 50 communicates to a gas path that communicates to at least two different gas flow lengths. In certain embodiments, as shown, the gas manifold 50 is a binary manifold. As such, the manifold 50 includes a gas inlet 52 which is split into two equal, or substantially equal, conductance paths 54. While such a binary manifold need not have symmetrical outlet arrangements or the same number of outlets stemming from the different gas flow lengths, this may be advantageous. As such, in certain embodiments, each of the paths 54 are split into two more equal, or substantially equal, conductance paths 56. Further, each of the paths 56 is again split into two more equal, or substantially equal, conductance paths 58. Finally, each of the paths 58 is further split into two more equal, or substantially equal, conductance paths 60, with each of the paths 60 terminating at a distinct outlet 62 of the manifold 50. Examples of the manifold inlet 52 and paths 54, 56, 58, and 60 include, but are not limited to, tubes, hollow shafts, ducts, hollow bars, hollow beams, or passages through a wall or walls of the manifold. As should be appreciated, the number of times the initial paths 54 are split is dependent on the desired number of outlets 62. As such, the embodiments of the present invention should not be limited to the configuration of FIG. 2. Moreover, as exemplified above, the initial paths 54 need not lead to the same number of outlets.

As described above, in using the binary manifold 50 for one or more gas manifolds 30 of FIG. 1, the same conductance path can be advantageously provided between the inlet 52 and each outlet 62 of the manifold 50 with very little capacitance being allowed. In certain embodiments, each conductance path has an equal flow resistance. Thus, in the system 10 of FIG. 1, when a binary manifold, e.g., manifold 50 of FIG. 2, is used for each of the gas manifolds 30, a uniform distribution of inflowing gas 63 (referenced in FIG. 2 as arrows) can be provided from the manifold 50 and a decreased (that is to say, improved) response time relating to the gas 63 flowing through the manifold 50 can be achieved in comparison to conventional tube-shaped gas manifolds.

As previously mentioned, it can be desirable to employ a plasma emission monitor (i.e., "PEM"). A PEM typically includes one or more collimators located in the sputter chamber and either a photomultiplier utilizing a filter or a spectrometer (typically located outside the sputter chamber). Each collimator has an optical probe with a lens that collects plasma information from inside the sputter chamber and downloads that to either the photomultiplier or the spectrometer. Using a photomultiplier with a filter blocks all of the light except the wavelength of interest and using a spectrometer collects the light from many different wavelengths but uses only the data for the wavelengths of interest. Either can be used with the gas manifold according to the embodiments of the invention.

The visual light from the plasma contains information of all the species present in the plasma via the optical emission spectrum. To monitor the intensity of any element in the plasma, a narrow band-pass filter can be used with each collimator to only allow the wavelength of light of the material or gas of interest through to the photomultiplier. Alternatively, the plasma light collected by each collimator is captured by a spectrometer. An analysis of the plasma intensity is made based on the information captured by the photomultiplier or the spectrometer.

Because the optical probe of the collimator is located in the sputtering chamber, it gets coated during the deposition process like everything else located in the sputtering chamber. Such a coating reduces the signal collected by the probe which has a disadvantageous effect on the sensitivity of the plasma emission measurements made.

Light emission from process relevant plasma particles is observed and tracked in real time. This allows continuous monitoring of plasma conditions and alteration can be made quickly if needed. The photomultiplier or spectrometer provides information about light of particular wavelengths that are characteristic of the plasma emissions of the elements to be monitored. By looking at the right wavelengths or combination of wavelengths, the amount of various ions in the plasma can be determined and this information can be used as feedback of a process parameter such as gas flow or voltage, for example, in order to control the process.

Real-time monitoring of the plasma process supports easy to make setting for the volume of introduced gas and plasma power. Product yield is increased through improved processing stability and the early detection of processing abnormalities.

Thus, the embodiments of the present invention allow a combination of a plasma emission monitor with a process gas delivery system that provides higher intensity plasma signals, less maintenance on the plasma emission monitor and more uniform gas distribution than the previously described systems.

In all of the embodiments described herein there can be a single collimator probe or there may be several. For example, the gas manifold may be broken up into segments such that the flow of gas can be changed to flow more or less gas through say only ⅕th or ⅓th of the width of the gas manifold. In such a situation with multiple segments, a PEM collimator can be monitoring each segment.

Figure 3:
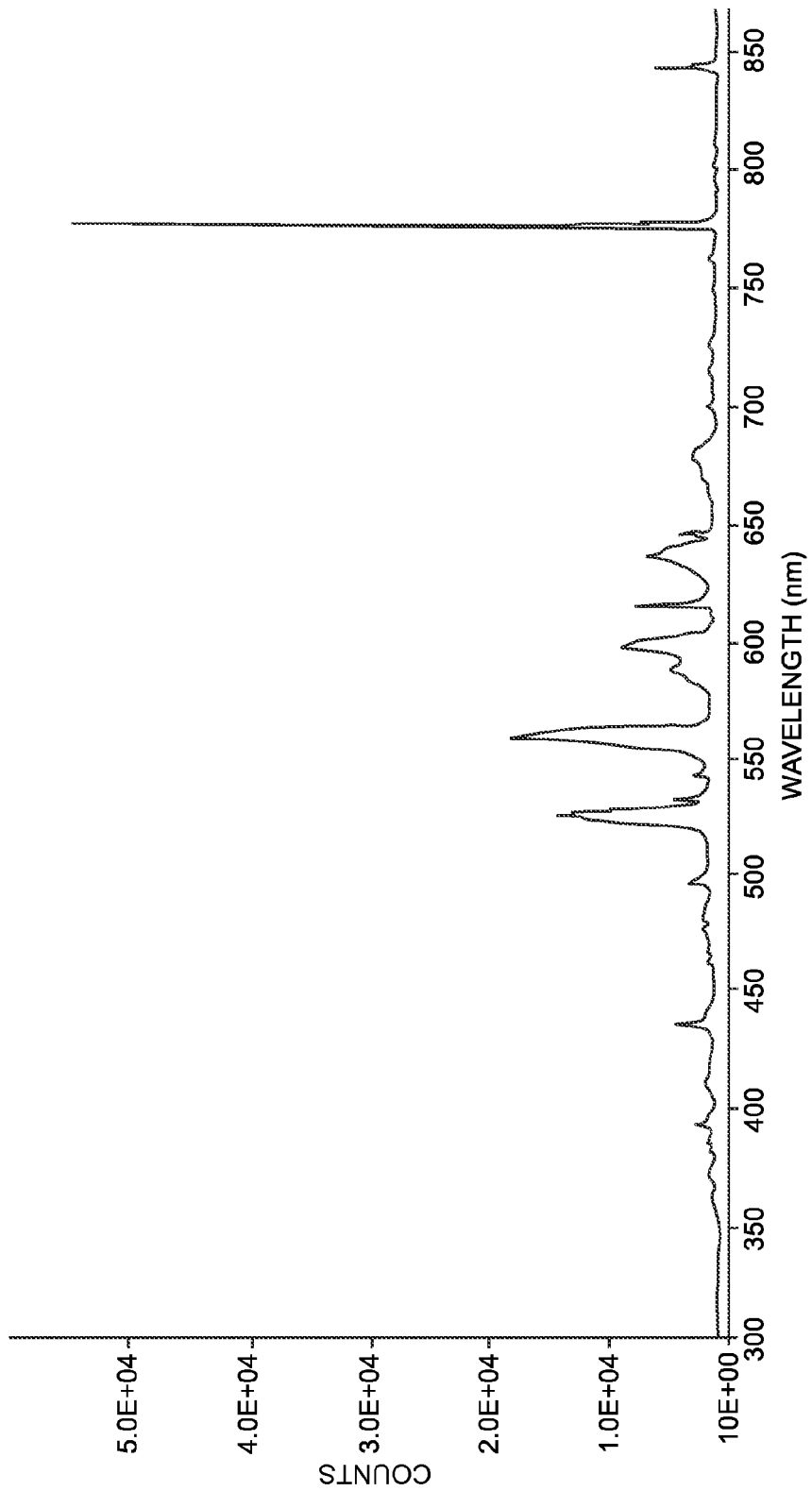
FIG. 3 is a graph of an oxygen plasma emission spectrum.

For example, FIG. 3 is a graph of an oxygen plasma emission spectrum. This illustrates the plasma emission from an oxygen plasma. Each peak is associated with a particular atom or ion. The peak at 777 nm is the strongest, so that would be a good option to monitor to track the amount of oxygen present in the plasma (by looking at the peak height over time). A feedback loop would be applied by the PEM so that if the oxygen signal drops, more oxygen is added to the process gas.

If you had peaks associated with multiple atoms or ions (such as oxygen and zinc when you are sputtering zinc oxide) you could track multiple peaks and use the feedback control to maintain a particular ratio between an oxygen peak and a zinc peak (for instance).

Natural variations in the process (movement of the glass through the coater, non-uniformity of the targets, changing base pressure, etc.) will affect the plasma composition, which in turns affects the properties of the film being grown. So the purpose of the PEM is to rapidly detect and correct changes in the plasma composition. If this works properly, it reduces or eliminates the amount of coated glass that is rejected due to film non-uniformity, and it also enables some processes that others would never run stable.

Figure 4:
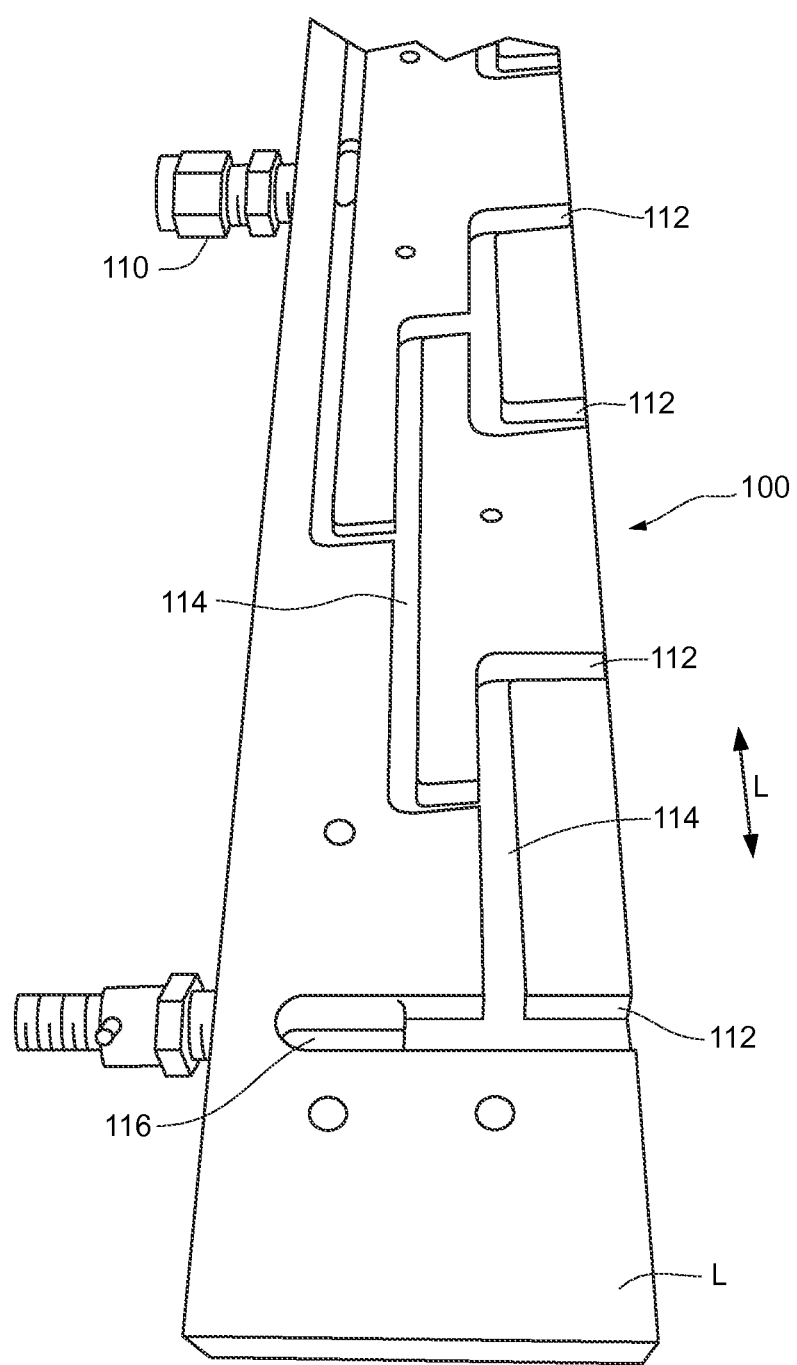
FIG. 4 is a photo of a perspective view of a gas manifold sliced in half according to an embodiment of the present invention designed to reduce or eliminate the disadvantages associated with the use of collimators of PEMs in sputtering chambers.

FIG. 3 is a photo of a perspective view of a gas manifold 100 according to an embodiment designed to reduce or eliminate the aforementioned problems with using collimators of PEMs in the sputtering chamber. The gas manifold 100 of FIG. 3 is shown sliced in half along a longitudinal axis I. The gas manifold preferably extends the entire width of the sputtering chamber. The gas manifold 100 is preferably a binary manifold and has an inlet port 110 operatively coupled to at least one gas supply (not shown) and a plurality of outlet ports 112. The inlet port 110 is in fluid communication with each of the outlet ports 112 via paths 114 of at least substantially equal conductance. The outlet ports 112 have a longitudinal axis that is perpendicular to the longitudinal axis I of the manifold. The gas manifold 100 also has at least one collimator port 116 for receiving an optical probe of a PEM therein, the collimator port is in fluid communication with one of the paths 114 to an outlet port 110 so that a lens end of an optical probe when received in the collimator port is exposed to gas flowing to the outlet port to which it is in fluid communication. The collimator port 116 has a longitudinal axis that is perpendicular to the longitudinal axis I of the manifold. The longitudinal axis of the collimator port may be parallel with the longitudinal axis of the gas outlet ports or it may be angled with respect thereto. Preferably the range of angles is from about 0° to about 30° In particular, a collimator port 116 conduit is located adjacent to an outlet at each end of the manifold 110 (of which only one is shown in FIG. 4). When the optical probe is positioned in the port 116, a lens of the optical probe is exposed to gas as it flows past the face of the optical probe before it is emitted by the outlet located adjacent to the probe.

Preferably the gas outputs are located roughly about every 2 inches. Of course, a seal is provided for the collimator port 116 so that when the optical probe is located therein so that gas does not exit through the collimator port 116.

Figure 5:
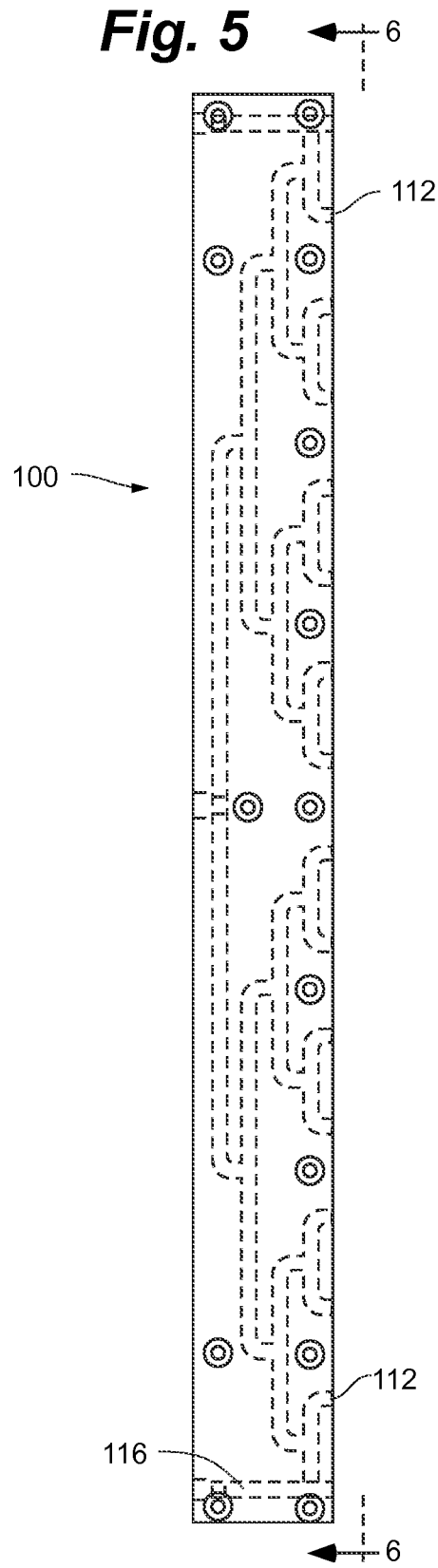
FIG. 5 is a schematic of a top view of a gas manifold according to an embodiment of the present invention.
Figure 6:
FIG. 6 is a schematic of a side view of the gas manifold shown in FIG. 4 taken along line 5-5.

FIG. 5 is a schematic of a top view of a gas manifold according to an embodiment of the invention. The inlet and outlets as well as the conduits coupling them are shown in dashed lines. Also shown in dashed lines are the conduits at each end of the manifold for the optical probe of a PEM. FIG. 6 is a schematic of a side view of the gas manifold shown in FIG. 4 taken along line 6-6. Also shown in FIG. 6 in dashed lines are the mounting tubes to mount the gas manifold into the sputtering chamber.

Figure 7:
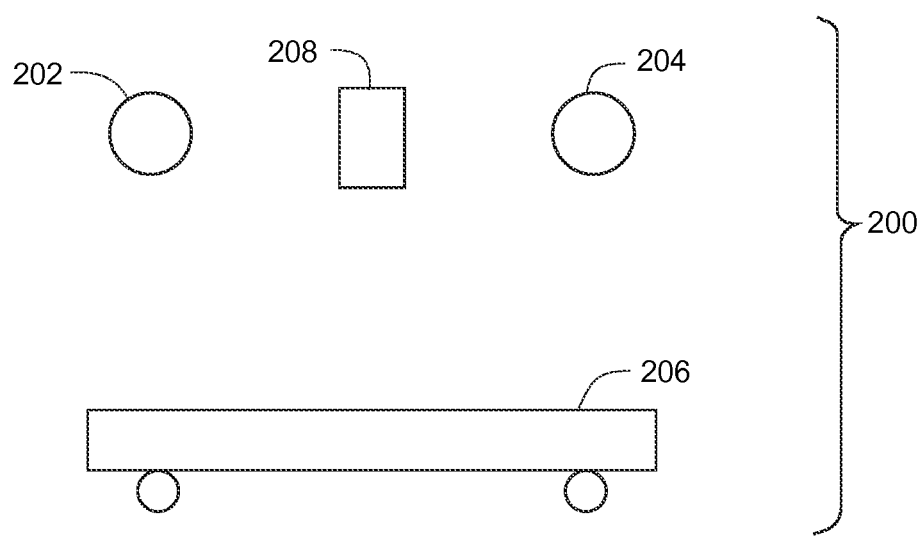
FIG. 7 is a schematic side view of a sputtering apparatus according to an embodiment of the present invention located in a sputter chamber.

FIG. 7 is a schematic side view of a sputtering apparatus according to an embodiment of the present invention located in a sputter chamber 200. While the sputter chamber 200 is shown with two targets 202, 204 located over the substrate 206 to sputter-down a coating, the gas manifold 208 according to the embodiment may also be used with targets located below the substrate for a sputter-up deposition.

In this embodiment a center gas manifold 208 is used between the targets 202, 204 so that the gas manifold's longitudinal axis (perpendicular to the plane of the Figure) is parallel to the target's longitudinal axes (also perpendicular to the plane of the Figure).

The gas outlets of the center manifold 208 point down (if it is used in a sputter down configuration) towards the substrate 206. The construction of the center manifold 208 is shown in greater detail in FIGS. 8-11.

Figure 8:
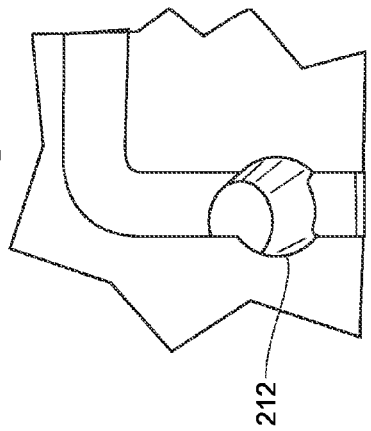
FIGS. 8-11 are various pictures of the gas manifold used in FIG. 7.
Figure 9:
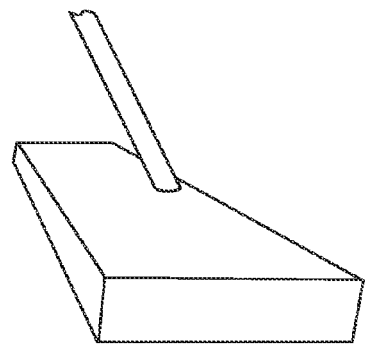
Figure 10:
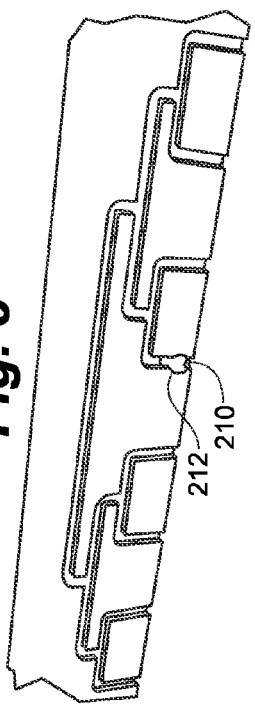
Figure 11:
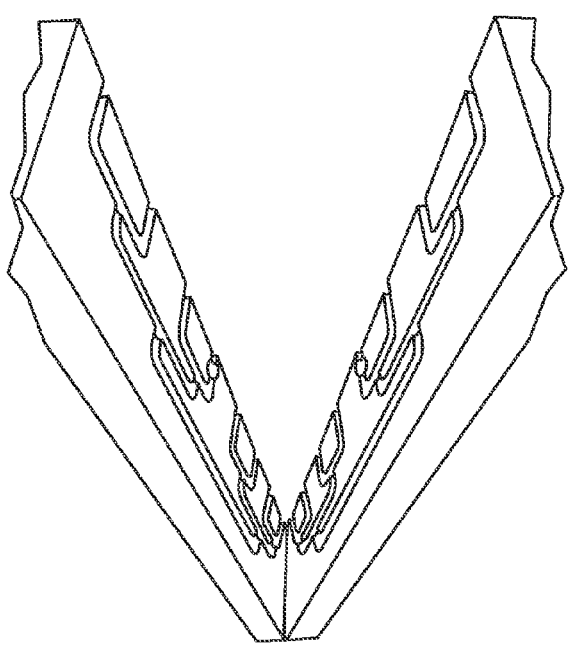

FIG. 8 shows the center gas manifold 208 split in half. The gas outlets 210, as previously mentioned, will point towards the substrate. The other half of the gas manifold, not shown, has an identical configuration. Towards the center of the gas manifold 208 is an optical port 212 used to house an optical probe of a plasma emission sensor. Unlike the optical ports previously described, the optical port 212 for the center gas manifold is angled with respect to the gas channels and gas ports. FIG. 9 shows a more detailed view of the angled port 212. In Particular, the port angles upwards. FIG. 10 shows the two halves of the gas manifold which will be joined together to form the center manifold 208. Each half will have an angled optical port 212 located about midway along the length of the manifold 208. In other embodiments, multiple angled optical ports may be found along the length of the manifold to house multiple optical probes if desired. FIG. 11 shows a pen located in the angle optical port 21 to better illustrate the angle of the port 212.

In one embodiment, the collimator ports are slightly angled relative to the outlet gas ports thereby allowing the optical probes mounted in the collimator ports to sense plasma directly below the target where it is brightest. Preferably the angle can range from about 15 to about 75 degrees, and, more preferably the angle ranges from about 30 to about 60 degrees.

Preferably the center gas bar can be any height relative to the targets but preferably the bottom of the gas bar is not below the bottom of the target. For this center gas manifold embodiment, two collimators are used directly across from one another so that each collimator is predominantly looking at the plasma of one of the two targets.

FIG. 12 is a schematic side view of a sputtering apparatus according to another embodiment of the present invention located in a sputter chamber 300. Again, while a sputter-down chamber is illustrated, this embodiment of the invention may be used with a sputter-up version as well. In this embodiment, a gas manifold 308 is located under the targets 302, 304 adjacent an edge as shown. In one embodiment, the collimator ports 312, shown in the expanded view, are parallel with the gas outlet ports so they look straight across the plasma but still observing the brightest part of the plasma.

The invention claimed is:

1. A gas delivery system for use in a reactive sputtering chamber, the system comprising:

a gas manifold having an inlet port and a plurality of outlet ports, the outlet ports directed in a first direction that will be perpendicular to a substrate when the system is in use the inlet port operatively coupled to the gas supply so as to receive gas at a selected gas pressure and each of the plurality of outlet ports located within the sputtering chamber, the inlet port in fluid communication with each of the plurality of outlet ports via paths of at least substantially equal conductance; and a collimator port in fluid communication with one of the outlet ports, wherein the collimator port is angled in a non-parallel orientation with respect to the one of the outlet ports so that a lens end of an optical probe when received in the collimator port is exposed to gas flowing to the outlet port to which it is in fluid communication, the optical probe operatively coupled to a plasma emission monitor.

2. A reactive sputtering apparatus, comprising:

a vacuum chamber for containing a substrate to be coated by a sputtering process;

a first target mounted in the vacuum chamber, the first target adapted to be energized as a cathode and having a surface to be sputtered for coating the substrate;

a gas supply;

a first gas manifold having an inlet port and a plurality of outlet ports, the outlet ports directed in a first direction that will be perpendicular to a substrate when the system is in use, the inlet port operatively coupled to the gas supply so as to receive gas at a selected gas pressure and each of the plurality of outlet ports located within the sputtering chamber, the inlet port in fluid communication with each of the plurality of outlet ports via paths of at least substantially equal conductance; and a collimator port in fluid communication with one of the plurality of outlet ports, wherein the collimator port is angled in a non-parallel orientation with respect to the one of the outlet ports so that a lens end of a first optical probe when received in the collimator port is exposed to gas flowing to the outlet port to which it is in fluid communication, the optical probe operatively coupled to a plasma emission monitor.

3. The apparatus according to claim 2 further comprising a second target adapted to be energized as a cathode and having a surface to be sputtered for coating the substrate, wherein the first and second targets are located over a substrate to be coated, the first and second target each having a longitudinal axis that are parallel to each other when the first and second targets are mounted in the vacuum chamber.

4. The apparatus according to claim 3 wherein the first gas manifold is located between the first and second target.

5. The apparatus according to claim 3 further comprising a substrate transport for supporting a substrate in the vacuum chamber.

6. The apparatus according to claim 3 further comprising a secondary gas manifold having an inlet port and a plurality of outlet ports, the inlet port operatively coupled to the gas supply so as to received gas at a selected gas pressure and each of the plurality of outlet ports located within the sputtering chamber, the inlet port in fluid communication with each of the plurality of outlet ports via paths of at least substantially equal conductance and a second collimator port in fluid communication with a different one of the plurality of outlet ports so that a lens end of a second optical probe when received in the collimator port is exposed to gas flowing to the outlet port to which it is in fluid communication, the second optical probe operatively coupled to the plasma emission monitor, the second optical probe located adjacent to at least one of the plurality of outlet ports of the second binary gas manifold, wherein the first gas manifold is located between the substrate transport and the first target and the second gas manifold is located between the substrate transport and the second target.

7. The apparatus of claim 1 wherein the gas manifold is a binary manifold, wherein the inlet port is in fluid communication via a path of equal conductance with each of the plurality of outlet ports.

8. The apparatus of claim 2 wherein the gas manifold is a binary manifold, wherein the inlet port is in fluid communication via a path of equal conductance with each of the plurality of outlet ports.

9. The apparatus of claim 2 wherein the gas manifold is a binary manifold, wherein the inlet port is in fluid communication via a path of equal conductance with each of the plurality of outlet ports.

10. The apparatus of claim 3 wherein the first and second gas manifolds are each a binary manifold, wherein the inlet port is in fluid communication via a path of equal conductance with each of the plurality of outlet ports.

11. The apparatus of claim 7 wherein the inlet of the gas manifold is evenly split into two of the paths, wherein each of the paths is continually and evenly split into further of the paths until a quantity of the paths equals the plurality of the gas outlet ports of the manifold.

12. The apparatus of claim 2 further comprising a gas rate control mechanism for receiving a target value of the emission intensity monitor and controlling a flow rate of at least one of the gases introduced to the vacuum chamber in accordance with the target value.

13. A method of using the apparatus as recited in claim 1 to deposit a film on the substrate by reactively sputtering the target when the substrate is located in the vacuum chamber.

14. A reactive sputtering method for forming a film on a substrate in a film forming space, the method comprising the steps of:
introducing at least one gas into the film forming space at a selected gas pressure, the film forming space having a first target mounted in a vacuum chamber, the first target adapted to be energized as a cathode and having a surface to be sputtered for coating the substrate, a gas supply and a first gas manifold having an inlet port and a plurality of outlet ports, the outlet ports directed in a first direction that will be perpendicular to a substrate when the system is in use, the inlet port operatively coupled to the gas supply so as to receive gas at a selected gas pressure and each of the plurality of outlets located within the vacuum chamber, the inlet port in fluid communication with each of the plurality of outlet ports via paths of at least substantially equal conductance; and monitoring emission intensity of plasma formed the in the film forming space with an optical probe having a first end for gathering light, the optical probe operatively coupled to a plasma emission monitor wherein the optical probe is located in the first gas manifold adjacent to at least one of the plurality of outlet ports of the first gas manifold, wherein the collimator port is angled in a non-parallel orientation with respect to the one of the outlet ports so that the first end of the optical probe is exposed to the gas flowing to the outlet port to which it is adjacent.

15. The method according to claim 14 further comprising the step of comparing the value of the plasma emission monitored by the optical probe with a desired range and if the comparison is outside the desired range, adjusting the flow rate of the at least one gas introduced into the film forming space to bring the value of the plasma emission monitored within the desired range.

16. The method according to claim 14 further comprising the step of allowing gas flowing out of the at least one outlet port adjacent to the optical probe to flow past the optical probe to substantially remove plasma deposited on the lens of the optical probe.

17. A gas manifold for delivering gas in a reactive sputtering chamber, the manifold comprising
a body having an inlet port and a plurality of outlet ports, the inlet port operatively coupled to the gas supply, the inlet port is fluid communication with each of the plurality of outlet ports, the outlet ports directed in a first direction that will be perpendicular to a substrate when the system is in use,
a collimator port having a proximal and a distal end, the collimator port located in the body separate from the inlet and outlet ports, wherein the collimator port is angled in a non-parallel orientation with respect to the one of the outlet ports, the collimator port dimensioned to receive an optical probe therein, wherein the distal end of the collimator port is fluidly coupled to an outlet port so that gas delivered to that outlet port flows past the distal end of the collimator port wherein the inlet of the gas manifold is evenly split into two of the paths, wherein each of the paths is continually and evenly split into further of the paths until a quantity of the paths equals the plurality of gas outlets of the manifold.

18. The gas manifold according to claim 17 wherein the inlet port is in fluid communication via a path of equal conductance with each of the plurality of outlet ports.

19. The gas manifold according to claim 1 wherein the collimator port has a longitudinal axis is parallel with respect to the longitudinal axes of the gas outlet ports.

20. The gas manifold according to claim 1 wherein the collimator port has a longitudinal axis that is angled with respect to the longitudinal axes of the gas outlet ports.

* * * * *